United States Patent
Konno et al.

(10) Patent No.: US 6,226,778 B1
(45) Date of Patent: *May 1, 2001

(54) METHOD AND APPARATUS FOR DETERMINING LOCATIONS OF CIRCUIT ELEMENTS INCLUDING SEQUENTIAL CIRCUIT ELEMENTS

(75) Inventors: Tadashi Konno; Keiko Ohsawa; Terunobu Maruyama, all of Kawasaki (JP)

(73) Assignee: Fujitsu Limited, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/895,233

(22) Filed: Jul. 16, 1997

(30) Foreign Application Priority Data

Feb. 14, 1997 (JP) ..................................................... 9-030915

(51) Int. Cl.⁷ .................................................. G06F 17/50
(52) U.S. Cl. ..................................... 716/10; 716/8; 716/9
(58) Field of Search ............................... 29/832, 834, 836, 29/740, 743; 716/2, 10, 11, 8, 9, 1

(56) References Cited

U.S. PATENT DOCUMENTS

| 4,236,301 | * | 12/1980 | Hug et al. | 29/740 |
|---|---|---|---|---|
| 4,706,187 | * | 11/1987 | Arai et al. | 700/86 |
| 4,914,808 | * | 4/1990 | Okumura et al. | 29/740 |
| 5,224,325 | * | 7/1993 | Takahashi et al. | 53/443 |
| 5,644,498 | * | 7/1997 | Joly et al. | 716/2 |
| 5,946,477 | * | 8/1999 | Ito | 716/9 |
| 5,999,716 | * | 12/1999 | Toyonaga | 716/10 |

FOREIGN PATENT DOCUMENTS 5-128207    5/1993    (JP).

* cited by examiner

*Primary Examiner*—Matthew Smith
*Assistant Examiner*—Vuthe Siek
(74) *Attorney, Agent, or Firm*—Armstrong, Westerman, Hattori, McLeland & Naughton (57) ABSTRACT

A circuit element placement method and apparatus in which circuit elements can surely be placed in a short time even if a circuit scale is increased. For this purpose, there is sequentially executed a first step of determining placement coordinates of sequential logic circuit elements among many circuit elements to be placed and a second step of determining placement coordinates of circuit elements other than the sequential logic circuit elements with consideration given to the placement coordinates of the sequential logic circuit elements, determined in the first step. The method and apparatus are applicable at a time of design of an integrated circuit such as LSI, or a circuit on a printed wiring board.

14 Claims, 10 Drawing Sheets

METHOD AND APPARATUS FOR DETERMINING LOCATIONS OF CIRCUIT ELEMENTS INCLUDING SEQUENTIAL CIRCUIT ELEMENTS

BACKGROUND OF THE INVENTION

(1) Field of the Invention

The present invention relates to a method and apparatus for determining placement coordinates of a circuit element (cell) at a time of design of an integrated circuit such as LSI, or a circuit on a printed wiring board.

(2) Description of the Related Art

In general, in order to design an integrated circuit such as LSI, a logic design is carried out depending upon a specification meeting functions of the LSI to be designed, and a packaging design is carried out depending upon a netlist obtained according to the logic design. In the packaging design, circuit elements (often referred to as cells) are placed depending upon the netlist, thereafter performing wiring among the placed circuit elements.

Moreover, the netlist has as information an input signal, an output signal, and interconnection of the circuit elements required for the signals, and is used for automatic placement or automatic wiring in the integrated circuit.

Further, in a conventional circuit element placement system, the netlist given by the logic design is directly used, and all unplaced circuit elements are concurrently handled and placed with consideration given to the entire circuit. Therefore, all the circuit elements become candidates for placement and movement at the same level.

However, in the above conventional circuit element placement system, all the unplaced circuit elements are concurrently handled so that an increase in circuit scale results in a reduction in processing speed and an increase in amount of memory. In addition, the concurrent handling of the entire circuit requires vast amounts of calculation in order to meet a delay constraint.

When a floor plan is manually executed, it is very difficult to predict whether or not the wiring can completely be performed, or predict whether or not the delay constraint can be met. Further, even in case of automatic schematic placement of the cells, a long processing time may be required depending upon an amount of handled data. It is thereby impossible to obtain a short turnaround time at a floor plan level.

Further, when an LSI chip to be designed is divided into a plurality of areas (blocks), and the circuit elements are placed, it is necessary to predict what placement is made in the respective blocks in order to determine points where the net passes across boundaries of the blocks. If the floor plan is manually executed, cell placement in the block is not made at the time. Thus, it is impossible to automatically find the points where the net passes across the boundaries of the blocks. In another system of finding the points where the net passes across the boundaries of the blocks after the schematic placement of the cells, a long time is required for the placement itself of the cells in case of a large circuit scale.

Further, since the given netlist is used in the original form in the prior art, the increase in circuit scale significantly extends an object to be considered, resulting in an extremely long processing time. Additionally, when various constraints are given, it is very hard to meet all the constraints because of the concurrent consideration of the entire circuit.

Besides, in the conventional system, all the cells become candidates for placement and movement at the same level so that, in many cases, the cells are placed without consideration to a configuration of the entire circuit. As a result, after automatic placement of the cells, there are caused problems in that, for example, a wiring length is excessively extended, and the delay constraint cannot be met.

SUMMARY OF THE INVENTION

In view of the foregoing problems, it is an object of the present invention to provide a circuit element placement method and apparatus in which circuit elements can surely be placed in short time even if a circuit scale is increased.

According to the present invention, for achieving the above-mentioned objects, there is provided a circuit element placement method for placing many circuit elements in a predetermined area according to positions of I/O pins when a circuit is designed. Further, the method sequentially executes the first step of determining placement coordinates of sequential circuit elements among circuit elements to be placed, and the second step of determining placement coordinates of circuit elements other than the sequential circuit elements with consideration given to the placement coordinates of the sequential circuit elements, determined in the first step.

Further, according to the present invention, there is provided a circuit element placement apparatus for placing many circuit elements in a predetermined area depending upon positions of I/O pins when a circuit is designed, and the apparatus includes a first placement determining unit to determine placement coordinates of sequential circuit elements among circuit elements to be placed, and a second placement determining unit to determine placement coordinates of circuit elements other than the sequential circuit elements with consideration given to the placement coordinates of the sequential circuit elements, determined by the first placement determining unit.

Thus, according to the circuit element placement method and apparatus of the present invention, the sequential circuit elements are placed at the first stage, and the remaining circuit elements are placed at the second stage. It is thereby possible to reduce a circuit scale to be handled at the time of circuit design, and limit a placement processing object. As a result, it is possible to provide a high quality placement result at high speed with respect to a large scale circuit which is difficult to handle and requires a long processing time in a conventional system.

Further objects, features and advantages of the present invention will become apparent from the following detailed description when read in conjunction with the accompanying drawings in which like parts or elements are denoted by like reference characters.

BRIEF DESCRIPTION OF THE DRAWINGS

FIGS. 13(*a*) and 13(*b*) are diagrams for explaining the procedure for placing cells other than FFs, RAMs in the embodiment.

DESCRIPTION OF THE PREFERRED EMBODIMENTS

[A] Description of Aspects of the Invention

Figure 1:
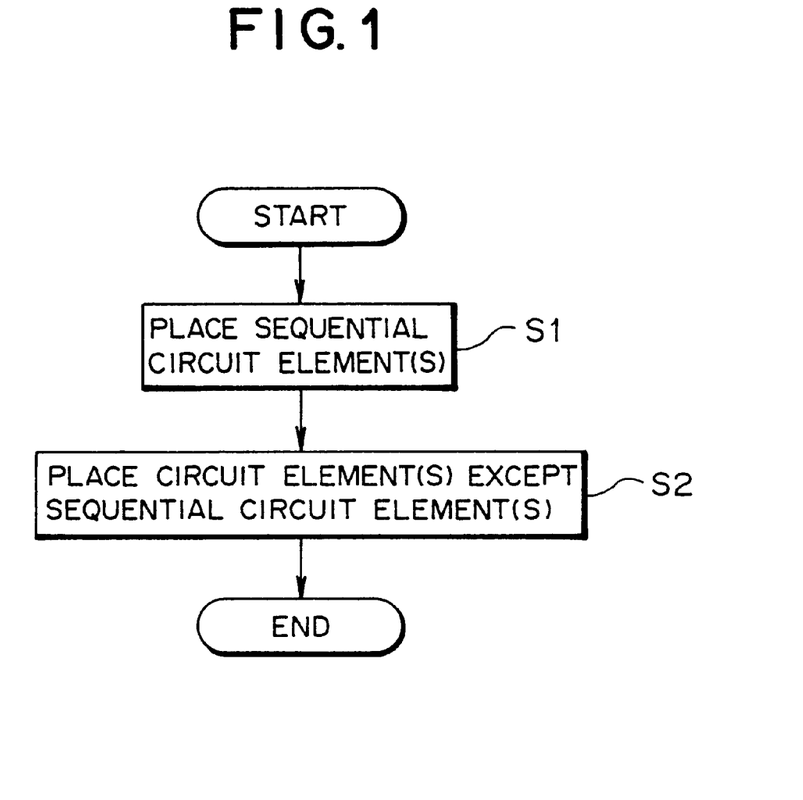
FIG. 1 is an explanatory view showing one aspect of a circuit element placement method according to the present invention.

FIG. 1 is an explanatory view showing a principle of a circuit element placement method according to the present invention. In the circuit element placement method according to the present invention, when a circuit is designed, many circuit elements are placed in a predetermined area depending upon positions of I/O pins. As shown in FIG. 1, the method sequentially executes Step S1 of determining placement coordinates of sequential circuit elements among many circuit elements to be placed, and Step S2 of determining placement coordinates of circuit elements other than the sequential circuit elements with consideration given to the placement coordinates of the sequential circuit elements, determined in the Step S1.

Moreover, when the predetermined area is divided into a plurality of blocks to respectively place the circuit elements in previously specified blocks, a shape and a size of each of the blocks may be set depending upon the placement coordinates of the sequential circuit elements determined in Step S1. Further, points where a net interconnecting the blocks passes across boundaries of the blocks may be determined depending upon the placement coordinates of the sequential circuit elements, determined in Step S1.

Alternatively, a subnetlist may previously be prepared by extracting information about the I/O pins and the sequential circuit elements from a netlist having designed circuit information, and the placement coordinates of the sequential circuit element may be determined in Step S1 depending upon the subnetlist.

In this case, the subnetlist may have as connection data the number of circuit elements other than the sequential circuit elements, located between the sequential circuit elements or between each of the I/O pins and each of the sequential circuit elements, or may have as connection data a logical distance between the sequential circuit elements.

Subsequently, the placement coordinates of the sequential circuit element, determined in Step S1 and the number of circuit elements in the subnetlist may be used to calculate in a reductive manner a delay value between the sequential circuit elements, or a delay value between each of the I/O pins and each of the sequential circuit elements, and the placement coordinates of the sequential circuit element may be determined in Step S1 with consideration given to the delay value.

Further, in Step S2, placement coordinates of circuit elements other than the sequential circuit elements may be determined with consideration given to the placement coordinates of the sequential circuit elements, determined in Step S1, and with additional consideration given to the netlist.

Figure 2:
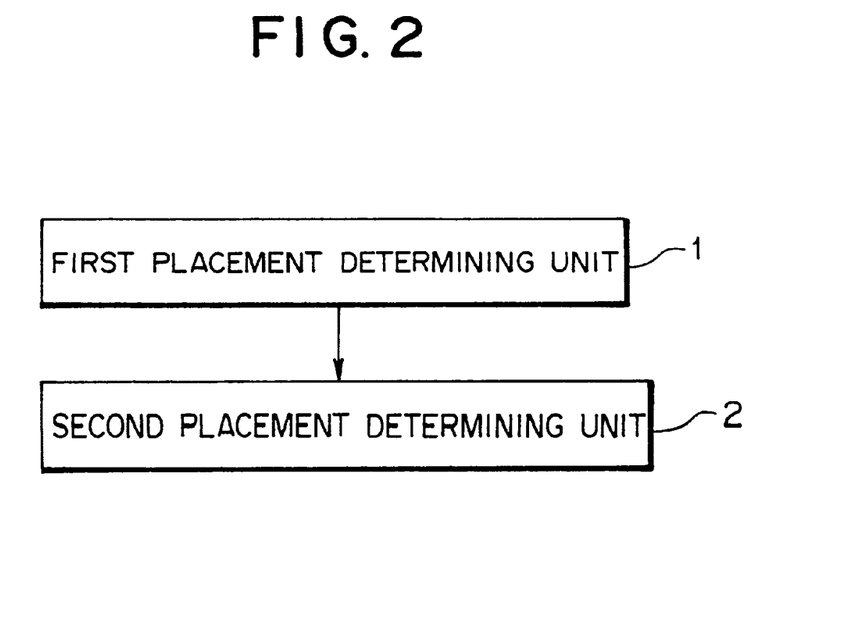
FIG. 2 is a block diagram showing one aspect of a circuit element placement apparatus according to the present invention.

On the other hand, FIG. 2 is a block diagram showing a principle of a circuit element placement apparatus according to the present invention. In the circuit element placement apparatus according to the present invention, when a circuit is designed, many circuit elements are placed in the predetermined area depending upon the positions of the I/O pins. As shown in FIG. 2, the apparatus includes a first placement determining unit 1 to determine the placement coordinates of the sequential circuit elements among many circuit elements to be placed, and a second placement determining unit 2 to determine the placement coordinates of the circuit elements other than the sequential circuit elements with consideration given to the placement coordinates of the sequential circuit elements, determined by the first placement determining unit 1.

Moreover, the circuit element placement apparatus may include a block setting unit in which, when the predetermined area is divided into the plurality of blocks to respectively place the circuit elements in the previously specified blocks, a shape and a size of each of the blocks are set depending upon the placement coordinates of the sequential circuit elements, determined by the first placement determining unit 1. Alternatively, in a boundary passing point determining unit, points where a net interconnecting the blocks passes across boundaries of the blocks may be determined depending upon the placement coordinates of the sequential circuit elements, determined by the first placement determining unit 1.

Alternatively, the circuit element placement apparatus may include a subnetlist preparing unit to prepare a subnetlist by extracting information about the I/O pins and the sequential circuit elements from a netlist having designed circuit information, and the first placement determining unit 1 may determine the placement coordinates of the sequential circuit elements depending upon the subnetlist prepared by the subnetlist preparing unit.

In this case, when the subnetlist is prepared, the subnetlist preparing unit may include in the subnetlist as connection data the number of circuit elements other than the sequential circuit elements, located between the sequential circuit elements, or between each of the I/O pins and each of the sequential circuit elements, or may include a logical distance between the sequential circuit elements in the subnetlist as the connection data.

Further, the circuit element placement apparatus may include a delay calculating unit to calculate in a reductive manner a delay value between the sequential circuit elements, or a delay value between each of the I/O pin and each of the sequential circuit elements by using the placement coordinates of the sequential circuit elements, determined by the first placement determining unit 1, and the number of circuit elements in the subnetlist. The first placement determining unit 1 may determine the placement coordinates of the sequential circuit elements with consideration given to the delay value calculated by the delay calculating unit.

Further, the second placement determining unit 2 may determine placement coordinates of circuit elements other than the sequential circuit elements with consideration given to the placement coordinates of the sequential circuit elements, determined by the first placement determining unit 1 and with additional consideration given to the netlist.

As described above, according to the circuit element placement method and apparatus of the present invention, the sequential circuit elements are placed at the first stage, and the remaining circuit elements are placed at the second stage. It is thereby possible to reduce a circuit scale to be handled at the time of circuit design, and limit a placement processing object. As a result, it is possible to provide a high quality placement result at high speed with respect to a large scale circuit which is difficult to handle and requires a long processing time in a conventional system.

Further, the sequential circuit elements closely related to an operating speed of the circuit are first schematically placed with consideration given to entire placement, resulting in easier application to placement in consideration of a delay time.

[B] Description of One Embodiment of the Invention

A description will now be given of an embodiment of the present invention referring to the accompanying drawings.

Figure 3:
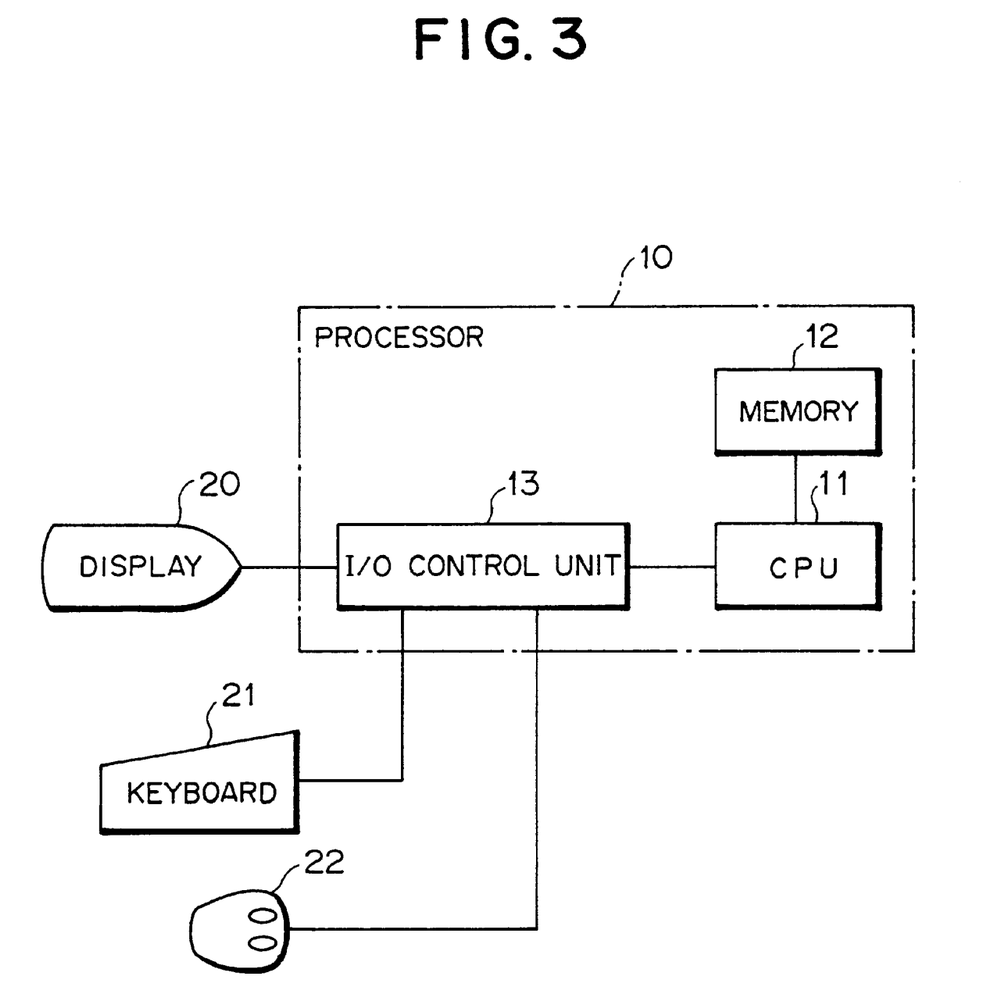
FIG. 3 is a block diagram showing a configuration of a processing unit serving as the circuit element placement apparatus according to one embodiment of the present invention.

FIG. 3 is a block diagram showing a configuration of a processing unit serving as a circuit element placement apparatus according to one embodiment of the present invention. As shown in FIG. 3, a display 20, a keyboard 21, and a mouse 22 are added to a processing unit 10 which serves as the circuit element placement apparatus in the embodiment.

The display 20 indicates progression of a circuit element placement made by the processing unit 10, and the keyboard 21 and the mouse 22 are operated by an operator, and are used for input of various types of information about the circuit element placement. Thus, the operator can input the various types of information by operating the keyboard 21 and the mouse 22 while seeing indication on the display 20, thereby placing the circuit elements in a conversational mode.

Further, the processing unit 10 is provided with a CPU 11, a memory 12, and an I/O control unit 13. The CPU 11 performs circuit element placement processing depending upon programs and various types of data such as netlist stored in the memory 12. While the progression of the circuit element placement processing performed by the CPU 11 is displayed on the display 20 as required through the I/O control unit 13, input information from the keyboard 21 and the mouse 22 are input into the CPU 11 through the I/O control unit 13, and are reflected in the circuit element placement processing.

Figure 4:
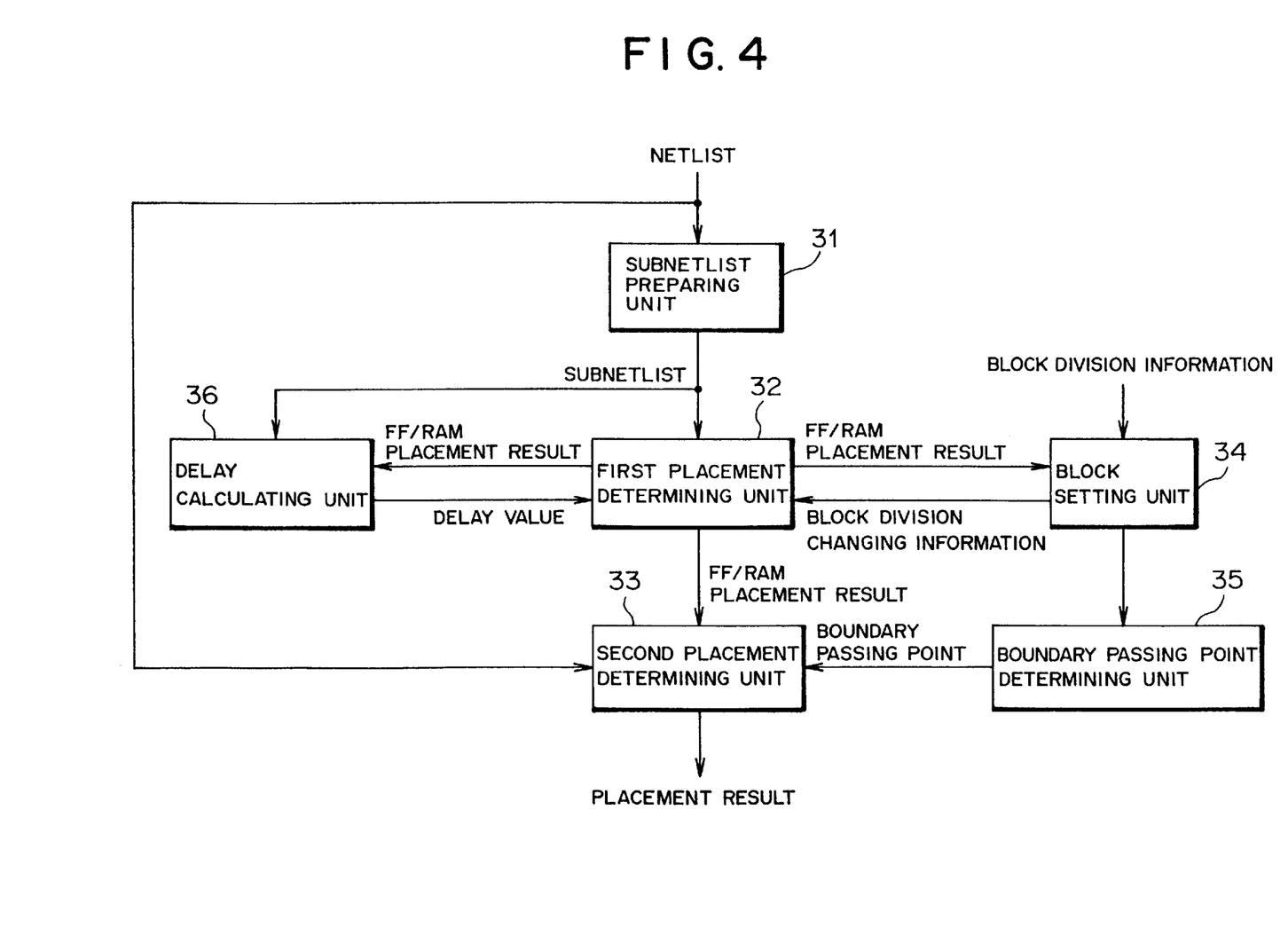
FIG. 4 is a block diagram showing a functional configuration of the circuit element placement apparatus according to the embodiment.

FIG. 4 is a block diagram showing a functional configuration of the circuit element placement apparatus in the embodiment implemented by the above-mentioned CPU 11. As shown in FIG. 4, in the circuit element placement apparatus in the embodiment when a circuit design of an LSI for example is performed, many circuit elements are placed in a predetermined area depending upon positions of I/O pins. The circuit element placement apparatus functions as a subnetlist preparing unit 31, a first placement determining unit 32, a second placement determining unit 33, a block setting unit 34, a boundary passing point determining unit 35, and a delay calculating unit 36.

Here, the subnetlist preparing unit 31 prepares a subnetlist by extracting information about both I/O pins (external I/O terminals, and circuit I/O terminals), synchronous sequential circuit elements such as flip-flop (hereinafter referred to as FF), and RAM (as will be described infra with reference to FIGS. 8 and 9). When the subnetlist is prepared, the subnetlist preparing unit 31 includes as connection data in the subnetlist the number of gates (the number of cells, or the number of circuit elements which will be described infra with reference to FIG. 10) other than the FFs and the RAMs, located between the FFs, or the RAMs, or between each of the I/O pins and each of the FFs or the PAMs, and a logical distance (which will be described infra with reference to FIG. 11) between the FFs or the RAMs.

The first placement determining unit 32 determines placement coordinates of the FF and the RAM serving as the synchronous sequential circuit element depending upon the subnetlist prepared by the subnetlist preparing unit 31. When the placement coordinates are determined, consideration is given to a delay value calculated by the delay calculating unit 36 discussed infra.

The second placement determining unit 33 determines placement coordinates of gates (circuit elements, cells) other than the FFs and the RAMs with consideration given to the netlist, the placement coordinates of the FFs and the RAMs, determined by the first placement determining unit 32, and positions of passing points determined by the boundary passing point determining unit 35 described below [as will be discussed infra with reference to FIGS. 13(a) and 13(b)].

When a predetermined area is divided into a plurality of blocks to place the cells in previously specified blocks, the block setting unit 34 sets a shape and a size of each of the blocks depending upon the placement coordinates of the FFs and the RAMs, determined by the first placement determining unit 32. In order to change the setting, block division setting changing information is sent back to the first placement determining unit 32. Thus, in the first placement determining unit 32, placement coordinates of the FF and the RAM are determined according to a new block division state (as will be described with reference to FIG. 6).

Figure 7:
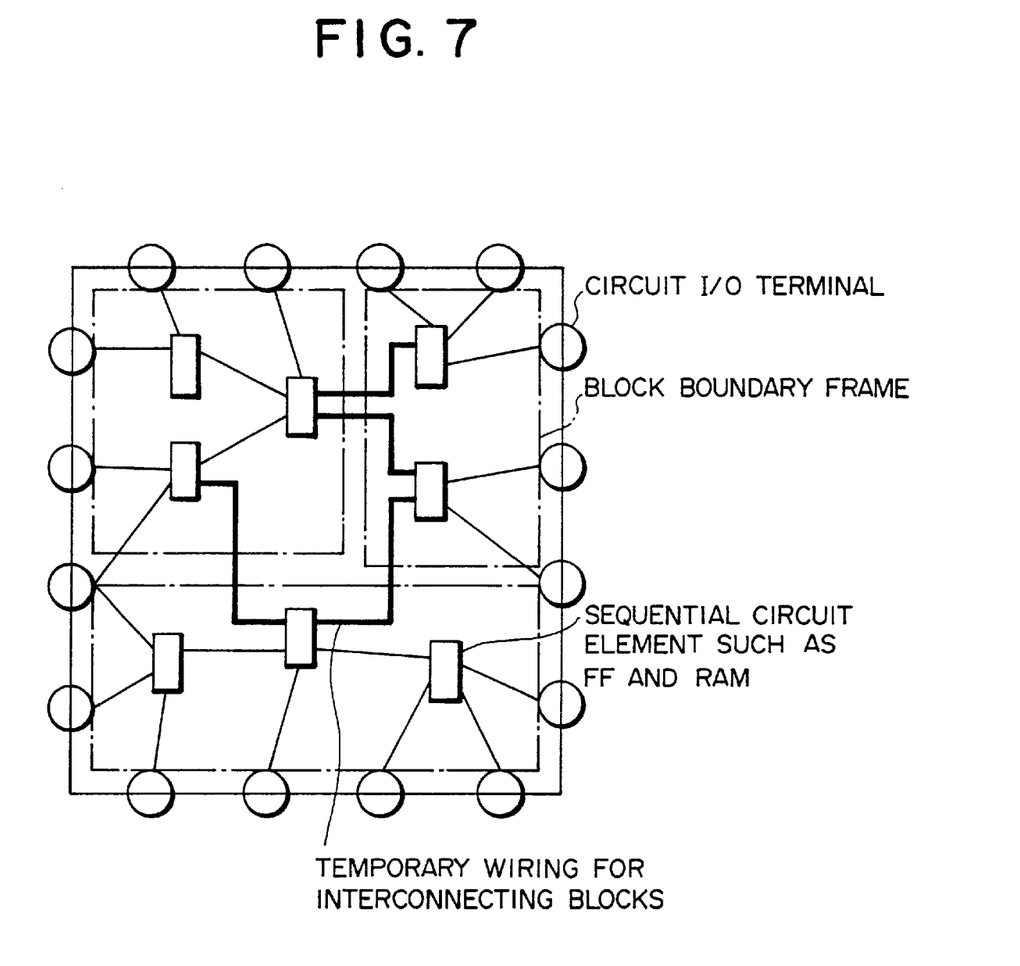

The boundary passing point determining unit 35 determines points where a net interconnecting the blocks passes across boundaries of the blocks depending upon the placement coordinates of the FFs and the RAMs, determined by the first placement determining unit 32 (as will be discussed infra with reference to FIG. 7).

The delay calculating unit 36 calculates in a reductive manner a delay value between the FFs or the RAMs, or a delay value between each of the I/O pins and each of the FFs, the RAMs by using both the placement coordinates of the FFs and the RAMs, determined by the first placement determining unit 32 and the number of gates in the subnetlist. A specific method of calculation will be described infra with reference to FIG. 12.

Figure 5:
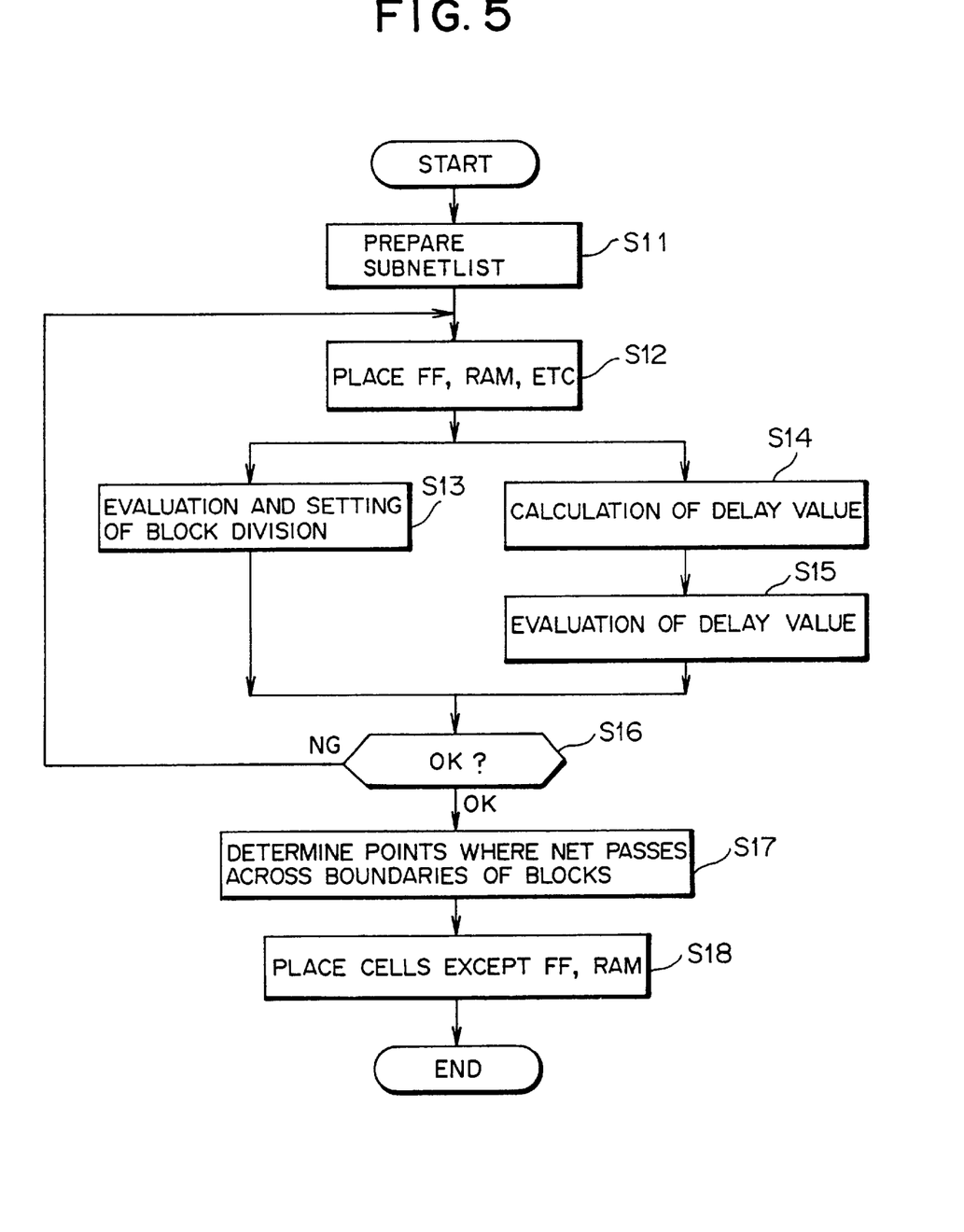
FIG. 5 is a flowchart for explaining the operation (the circuit element placement method) according to the embodiment.

A brief description will now be given of a circuit element placement operation in the embodiment of the apparatus having the above configuration with reference to the flowchart (Steps S11 to S18) shown in FIG. 5.

In design of a circuit such as LSI, when a netlist having information of the circuit to be designed is given, the subnetlist preparing unit 31 first extracts information about the I/O pins, the FFs, and the RAMs from the netlist to prepare a subnetlist (Step S11). At the same time, the subnetlist preparing unit 31 extracts the number of gates located between the FFs or the RAMs, or located between each of the I/O pins and each of the FFs or the RAM, and the logical distance between the FFs or the RAMs, thereby including the number of gates and the logical distance in the subnetlist as connection data.

Subsequently, the first placement determining unit 32 determines the placement coordinates of the FFs and the RAMs depending upon the subnetlist prepared by the subnetlist preparing unit 31 (Step S12).

An FF/RAM placement result obtained by the first placement determining unit 32 is sent to the block setting unit 34 and the delay calculating unit 36 (see FIG. 4).

The block setting unit 34 evaluates the size and the shape of each of the blocks depending upon the placement coordinates of the FFs or the RAMs, determined in Step S12, and sets the block according to an evaluation result (Step S13).

Further, the delay calculating unit 36 calculates in the reductive manner the delay value between the FFs or the RAMs, or the delay value between each of the I/O pins and each of the FFs or the RAMs depending upon both the placement coordinates of the FFs or the RAMs, determined in Step S12, and the number of gates in the subnetlist (Step S14). Subsequently, the first placement determining unit 32 evaluates whether or not the delay value meets a constraint (Step S15).

When the setting of the block is changed in Step S13, or when the evaluation results in an inappropriate delay value in Step S15 (i.e., in case of an NG decision in Step S16), the process returns to Step S12 where the first placement determining unit 32 redetermines placement coordinates of the FFs and the RAMs depending upon the subnetlist and a new block division state or a new delay value.

When an OK decision is obtained in Step S16, the boundary passing point determining unit 35 determines points where the net interconnecting the blocks passes across the boundaries of the blocks depending upon the placement coordinates of the FFs or the RAMs, determined in Step S12 (Step S17).

Subsequently, the second placement determining unit 33 determines the placement coordinates of the cells other than the FFs or the RAMs with consideration given to the netlist, the placement coordinates of the FFs or the RAMs, determined in Step S12, and the positions of the passing points determined in Step S17 (Step S18).

A more specific description will now be given of the operation and the effect of the embodiment.

[1] Placing Cells Other than FF/RAM After Placing FF/RAM

The present invention is basically characterized by, when the cells are placed depending upon the positions of the I/O pins (circuit I/O terminals) of the circuit, first determining only the placement coordinates of the synchronous sequential circuit elements such as FF and RAM, thereafter placing the remaining cells (combinational circuit elements) in the vicinity of the FF or the RAM.

In a method of placing with consideration concurrently given to all the cells, it is greatly difficult to obtain a satisfactory placement result in a short time with respect to a current large scale circuit. Thus, attention is given to a circuit configuration. Currently, almost all logic circuits include the synchronous sequential circuit in which an operation is performed by feeding a clock to the FF located in the circuit. Consequently, if a flow of signal in the circuit is simplified, a signal flows from an input pin and reaches an output pin through some of the FFs. In addition, if the cell is limited to the FF, the number of cells in the circuit is several tens of thousands at the maximum, resulting in about one-tenth of all the number of cells achieving hundreds of thousands in the entire circuit.

Hence, according to the present invention, the cells are placed at two stages. At the first stage (in the first placement determining unit 32 shown in FIG. 4, and in Step S12 of FIG. 5), only the FFs or the RAMs are placed in the circuit depending upon the positions of the I/O pins of the circuit. At the next stage (in the second placement determining unit 33, and in Step S18), the remaining general cells (combinational circuit elements) are placed depending upon the placement coordinates of the FFs or the RAMs. It must be noted that the placement coordinates of the FFs can be adjusted at the second stage.

Further, at the second stage, the general cells (gates) are placed in the vicinity of the FFs or the RAMs, and are typically placed in a limited range with center of lines for connecting the I/O pins to the FFs, the RAMs, or with center of lines for interconnecting the FFs or the RAMs as will be described in FIGS. 13(*a*) and 13(*b*). These gates are placed in the order of proximity to the FFs or the RAMs, and their placement coordinates are determined with consideration given to a direction in which a signal passes through the gate.

In such a manner, it is possible to replace the design of the logic circuit including the hundreds of thousands of cells with a design of a logic circuit including tens of thousands of cells at the first stage, thereby reducing a scale of an object to be designed. At the second stage to place the remaining cells, since there have been determined the placement coordinates of the FFs or the RAMs to which the general cells are connected, an area left for placement is limited to only a small part in the circuit. It is thereby possible to reduce a circuit scale to be handled when a circuit is designed.

Thus, since a placement processing object can be limited, it is possible to provide a high quality placement result at high speed with respect to a large scale circuit which is difficult to handle and requires a long processing time in the conventional system. Further, the sequential circuit elements such as RAM and FF closely related to the operating speed of the circuit are first schematically placed with consideration given to the entire placement, resulting in easier application to placement in consideration of the delay time.

[2] Setting of Block

Figure 6:
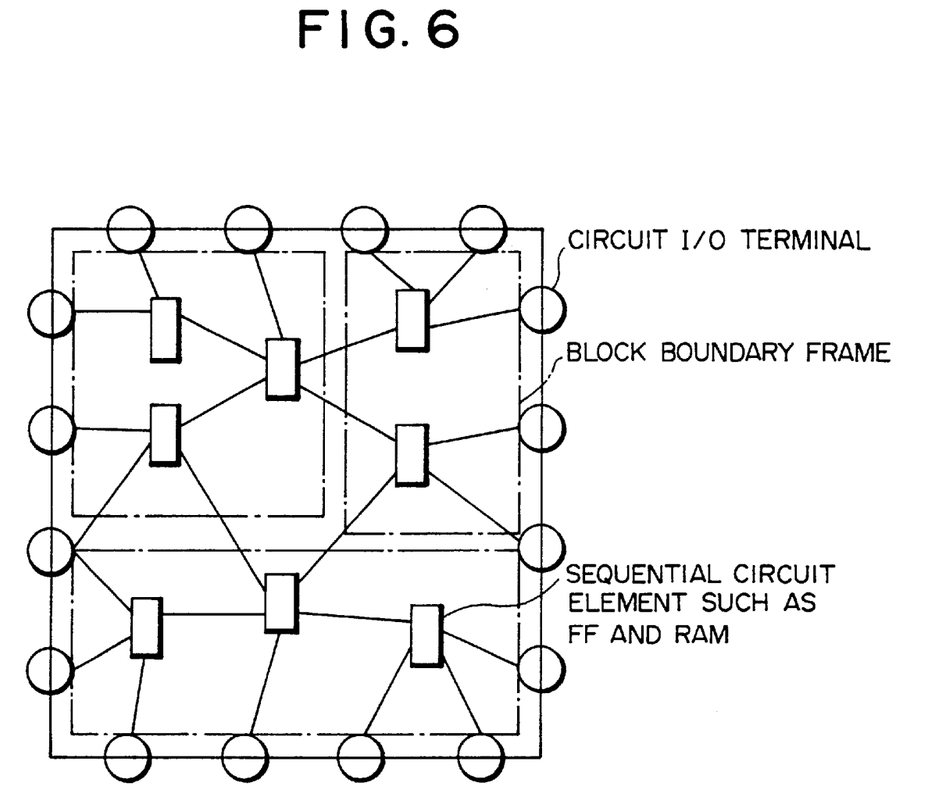
FIGS. 6 and 7 are diagrams for explaining the operation according to the embodiment.

In the embodiment, when a floor plan is executed, the block setting unit 34 shown in FIG. 4 (in Step S13 of FIG. 5) finds and sets a schematic shape and a schematic size of each of the blocks depending upon the placement of FF/RAM as shown in FIG. 6. In FIG. 6, a hollow bullet designates a circuit I/O terminal (I/O pin), a square shown by the solid line is the sequential circuit elements such as RAM and FF, and an area surrounded by the one dot chain line is a set block.

It is thereby possible to know whether or not the block has a proper size and a proper shape when all the FFs or RAMs are placed in the chip. The flow of signal is formed by the placement of the FFs. At the time, in case of a result which does not meet a performance target, it is necessary to re-create the floor plan.

When the FFs or RAMs are placed in a circuit which is previously manually divided into blocks, the FFs or RAMs are respectively placed in specified areas. At the time, it is possible to know whether or not information of the area (block) given by the floor plan is proper by feeding back the complexity of the signal flow in the entire circuit and the delay value from the displacement result.

For example, if a certain block has an excessively complex signal flow, a larger area is required for the block. If a delay value between the FFs in the block is too high, the block should be made smaller. Further, when a delay value between the FFs respectively located in different blocks is too high, a distance between the blocks should be reduced, or a size of the block should be reduced. The above processing is made in the block setting unit 34 shown in FIG. 4 (in Step S13 of FIG. 5).

[3] Determining Block Boundary Passing Point

In the embodiment, the boundary passing point determining unit 35 shown in FIG. 4 (in Step S17 of FIG. 5) finds points where a net interconnecting the blocks passes across boundaries of the blocks depending upon the placement coordinates of the FF/RAM when the floor plan is executed.

Only after the boundaries of the blocks have been specified, and internal schematic placement has been finished, it is possible to determine where the net passing across the boundaries of the blocks passes. The passing point (virtual pin position) is set at a position for interconnecting the FFs or the RAMs in the shortest distance depending upon information about which FFs the net passing across the boundaries of the blocks interconnects, and about where the FFs are placed. When a specific placement is made in the block at the second stage, the information serves as one factor to determine the placement coordinates of the general cell. FIG. 7 shows illustrative boundary passing points determined for the block set as shown in FIG. 6. The solid line in FIG. 7 shows temporary wiring for interconnecting the blocks.

[4] Subnetlist

In the embodiment, prior to placing the FF or the RAM, the subnetlist preparing unit 31 shown in FIG. 4 (in Step S11 of FIG. 5) prepares a subnetlist by extracting information about the I/O pins and the cells such as RAM/FF from the given circuit information (netlist).

When the schematic placement of the FF or the RAM is made, in the embodiment, there is used the subnetlist prepared by modifying the externally given netlist. That is, the subnetlist is prepared by extracting both the external I/O terminals and the FFs or the RAMs, and the subnetlist is used to place the FFs or the RAMs. On the subnetlist, only the FF and the RAM are defined as the cell, and only data signal lines for interconnecting the external I/O terminals, the FFs, and the RAMs can form the net. In other words, the subnetlist does not include other signal lines for clock, reset, and so forth.

When the subnetlist is prepared, a back trace is first started from the external output terminal or a data signal pin of the RAM/FF, and the trace is continued to reach the external input terminal or an output terminal of the RAM/FF. Combinations of the external I/O terminals and the RAM/FF found in the above manner are shown as one net. The subnetlist does not include gates (cells other than the sequential circuits) through which the net passes on the way.

Figure 8:
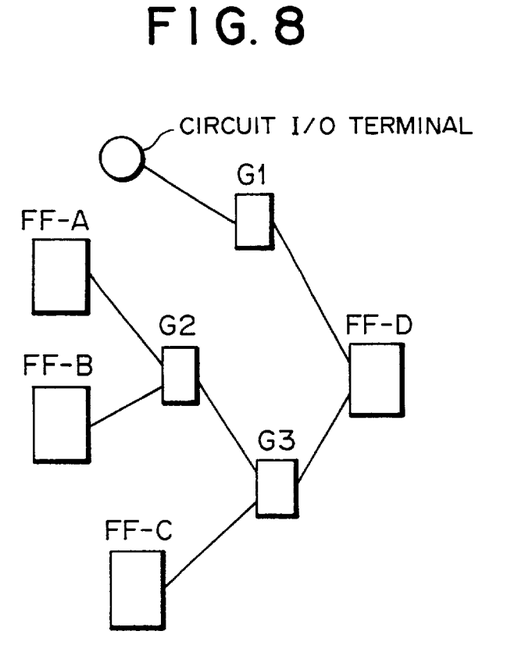
FIG. 8 is a diagram for explaining a netlist in the embodiment.
Figure 9:
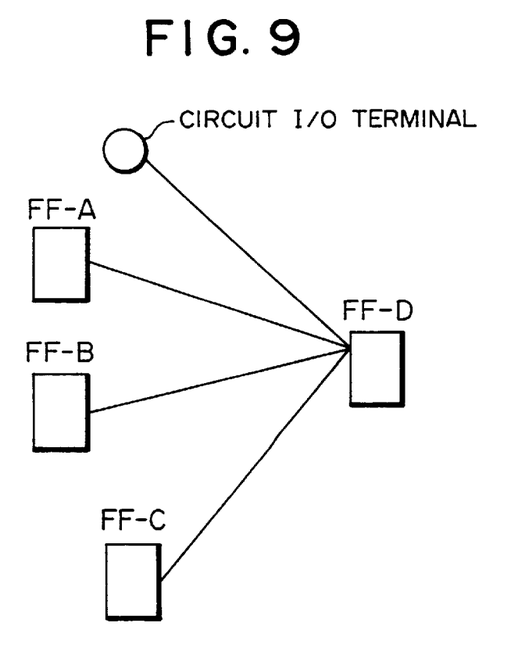
FIG. 9 is a diagram for explaining a subnetlist in the embodiment.

For example, FIG. 9 shows a subnetlist prepared from a netlist which instructs to configure the circuit as shown in FIG. 8. FIG. 8 shows a gate G2 serving as the confluence of a signal from an FF FF-A and a signal from an FF FF-B, a gate G3 serving as the confluence of output from the gate G2 and a signal from an FF FF-C, and an FF FF-D serving as the confluence of output from the gate G3 and a signal from the circuit I/O terminal through the gate G1. Here, any one of the gates G1 to G3 is the cell other than the sequential circuit element. As shown in FIG. 9, the subnetlist extracted from the netlist shown in FIG. 8 disregards the gates G1 to G3, and instructs interconnection between the circuit I/O terminal and the four FFs FF-A to FF-D.

As set forth above, by using the simplified subnetlist, it is possible to easily know the interconnection between the circuit I/O terminal and the RAM/FF at a time of placement operation, resulting in a significant enhancement of a placement processing speed.

[5] Gate Number Information in Subnetlist

In order to prepare the subnetlist as described above, in the embodiment, the subnetlist is set to have as connection data the number of gates other than the FFs and the RAMs, located between the FFs or the RAMs, or between the I/O pin and the FF or the RAM. Thereby, the first placement determining unit 32 shown in FIG. 4 (in Step S12 of FIG. 5) refers to the number of gates, and controls placement of the RAM/FF according to the number of gates.

Figure 10:
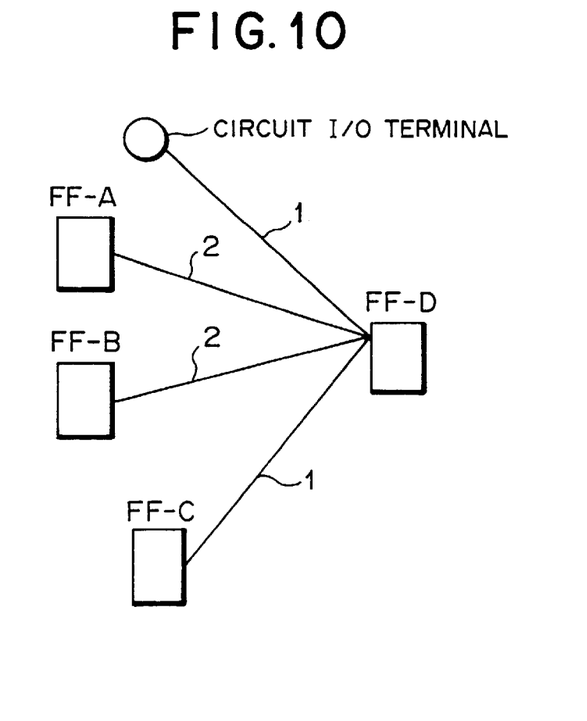
FIG. 10 is a diagram for explaining gate number information included in the subnetlist in the embodiment.

That is, in the embodiment, in subnetlist preparation process with the netlist simplified as stated above, it is possible to know how many gates are located on one net. The information is held in information of each net of the subnetlist. For example, the subnetlist extracted from the netlist shown in FIG. 8 includes the gate number information as shown in FIG. 10. In FIG. 10, the numeral given to each net indicates the number of gates located on the net.

After the placement of the FFs or the RAMs is completed, the remaining general cells are placed. As a rule, the general cell is placed in an area with center of lines for interconnecting the FFs or the RAMs. At the time, a distance between the FFs or the RAMs may extremely be short as compared with the number of gates located between the FFs or the RAMs. In such a case, the placement coordinates may be determined with appropriate gaps previously set between the FFs or the RAMs so as not to cause unexpected wiring complexity due to placement of intermediate gates.

[6] Logical Distance Information in Subnetlist

In order to prepare the subnetlist as described above, in the embodiment, the subnetlist is set to have as connection data logical distances between the FFs or the RAMs, that is, information about what tree structure is formed by confluences of signals from the input pin and the RAM/FF. Thereby, the first placement determining unit 32 shown in FIG. 4 (in Step S12 of FIG. 5) refers to the logical distance, and controls placement of the RAM/FF according to the logical distance.

In subnetlist preparation process with the netlist simplified as stated above, each gate information of the subnetlist is set to have the logical proximity (logical distance) between the FFs to output a signal input into a certain FF.

In a netlist having all the circuit information, it is possible to know branches and confluences of signals by tracing the gates. However, in the simplified subnetlist, it is impossible to obtain the above information only by tracing. Thus, the logical distance information plays an important role in determining a relation between positions of the FFs.

For example, in case of a netlist having circuit information shown in FIG. 8, the logical distance between the FFs FF-A and FF-B is shorter than a logical distance between the FFs FF-A and FF-C, or between the FFs FF-B and FF-C. Further, when the FFs FF-A to FF-D are placed, in the embodiment, the placement is made with consideration such that the distance between the FFs FF-A and FF-B is shorter than the distance between the FF FF-C and the FF FF-A or FF-B.

The logical distance is a value to be found for all the FFs connected to the certain FF so that the logical distances can be expressed in a matrix held by all the FFs present in the subnetlist.

Figure 11:
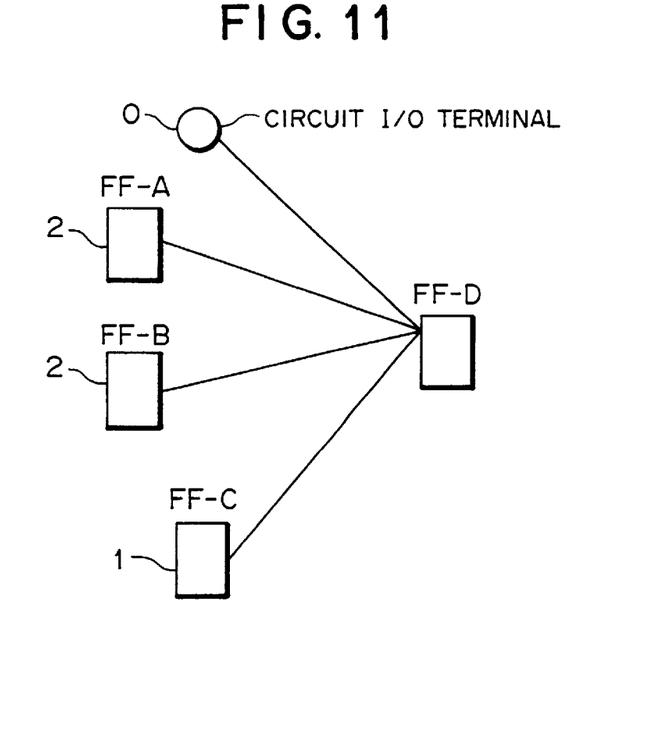
FIG. 11 is a diagram for explaining logical distance information included in the subnetlist in the embodiment.

For example, the subnetlist extracted from the netlist shown in FIG. 8 includes logical distance information as shown in FIG. 11. The numerals respectively given to the circuit I/O terminal and the FFs FF-A to FF-C indicate the logical distances. Specifically, the numeral corresponds to the number of branches found while the signals from the circuit I/O terminal and the FFs FF-A to FF-C can reach the FF FF-D.

Further, the numeral indicating the above logical distance is found in back trace process when the subnetlist is prepared (when the circuit is simplified). It is shown that the logical distance is shorter as an end unit of a trace has more branches (that is, the numeral is higher).

[7] Reductive Delay Operation

In the embodiment, the delay calculating unit 36 shown in FIG. 4 (in Step S14 of FIG. 5) calculates in a reductive manner the delay value between the FFs or the RAMs, or the delay value between each of the I/O pins and each of the FFs or the RAMs depending upon the placement of the FFs or the RAMs, and the gate number information in the subnetlist, thereby placing the RAM/FF according to the delay value.

That is, the number of gates located between the FFs or the RAMs is held as net information in the subnetlist, thereby calculating the delay value in the reductive manner to make the placement with consideration given to the delay value.

A description will now be given of a method of calculating the delay value. When a delay value Dn per unit wiring length and a delay value Dg per gate are externally given, in order to set a delay value between two FFs to T or less, a distance L between the two FFs in the longest distance may be found in the reductive manner as follows:

$$(T-Dg \times \text{the number of gates})/Dn$$

Figure 12:
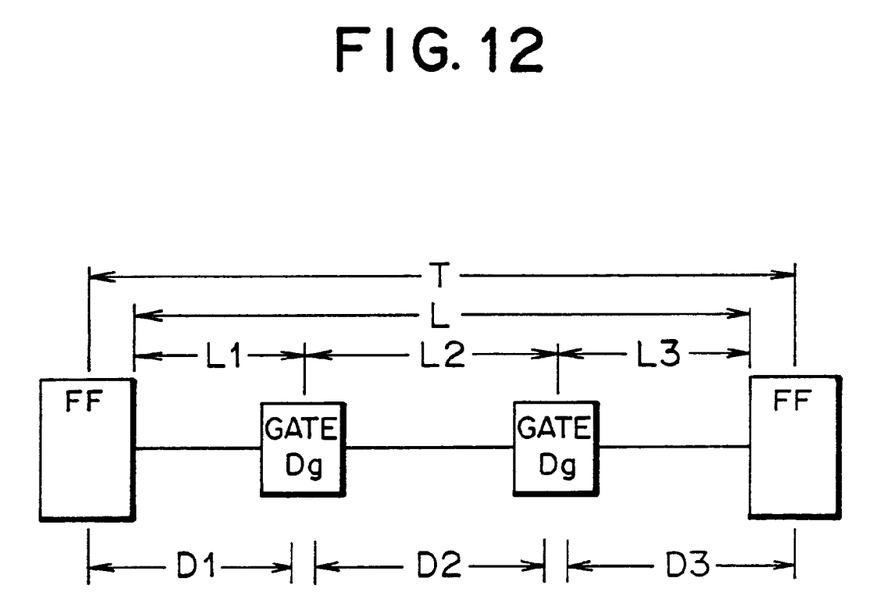
FIG. 12 is a diagram for explaining a reductive delay operation in the embodiment.

For example, when two gates are located between two FFs as shown in FIG. 12, delay values D1, D2, and D3 between the FF and the gate, between the gates, and between the gate and the FF can respectively be found by the following expressions:

D1=L1×Dn;

D2=L2×Dn; and

D3=L3×Dn where

L1: distance between the FF and the gate;

L2: distance between the gates; and

L3: distance between the gate and the FF

If a limited value of the delay value between the two FFs is defined as T, $$T=D1+D2+D3+Dg \times 2=(L1+L2+L3) \times Dn+Dg \times 2$$

Further, the distance L between the two FFs can be expressed as follows:

L=L1+L2+L3

Accordingly, the above expression can be written as follows:

$$T=L \times Dn+Dg \times 2$$

When the expression is solved for L, $$L=(T-Dg \times 2)/Dn$$

That is, a delay constraint can be met by placing the FFs such that the distance L between the FFs becomes (T−Dg× 2)/Dn or less.

[8] Procedure for Placing Cells Other than FFs and RAMs

In the embodiment, at the second stage (in the second placement determining unit 33 shown in FIG. 4, and in Step S18 of FIG. 5), the placement coordinates of the cells other than the FFs or the RAMs are determined depending upon the netlist, the placement coordinates of the FFs or the RAMs, and the position of the block passing point. A description will now be given of the procedure for placing the cells.

Since the RAMs and the FFs are previously positioned, it is facilitated to roughly determine the placement coordinates of the remaining cells by checking from which RAM/FF a path passing through the cell is output, and into which RAM/FF the path is input. At the second stage, the first given netlist is used instead of the subnetlist. This is because it is not an object to find at the time the schematic placement coordinates of the RAM/FF serving as the key to the placement, but it is an object to specifically determine the placement coordinates of all the cells.

After it is checked between which RAM/FFs the path passing through the cell is located, the cell is placed as close to a line for connecting the RAM/FFs as possible. The cells are placed in the order of proximity to an end point of the path, that is, the input pin of the RAM/FF. This is because, as the cell is located closer to input, there is left less place suitable for the cell. In addition, the placement is started from a path on which a stronger delay constraint is placed. All the cells are placed at positions assumed to be optimal, and specific placement of the cells is thereafter corrected with consideration given to the entire complexity, that is, wiring ease. In this case, a correction may be made to the placement of the initially placed RAM/FFs.

Figure 13A:
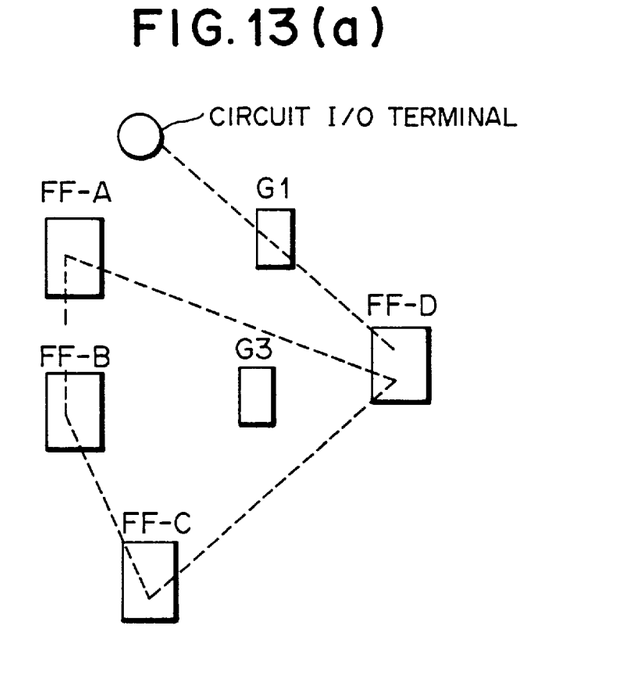
Figure 13B:
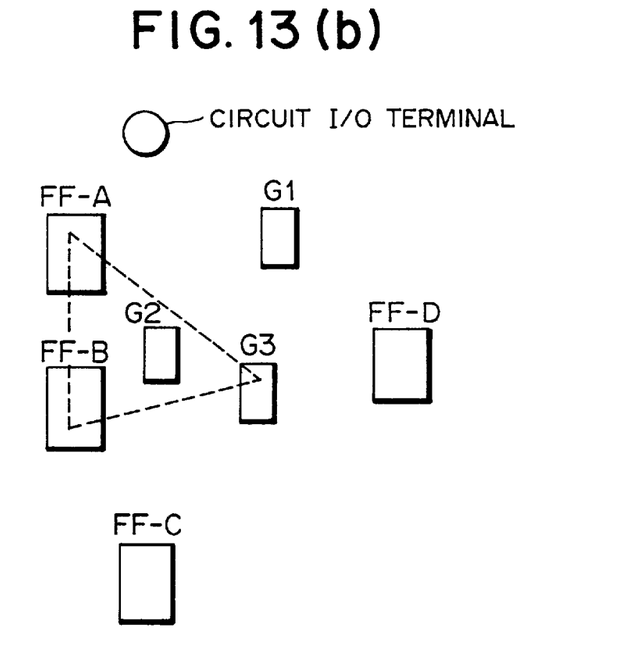

For example, as shown in FIG. 13(a), a gate G1 is first placed on a path (see the dotted lines) for connecting an FF FF-D to a circuit I/O terminal while a gate G3 is placed in an area surrounded by FFs FF-A to FF-D (i.e., in a square area surrounded by the dotted lines). Subsequently, as shown in FIG. 13(b), a gate G2 is placed in an area surrounded by the gate G3, the FFs FF-A, and FF-B (i.e., a triangular area surrounded by the dotted lines).

The present invention is not limited to the specifically described embodiment, and variations and modifications may be made without departing from the scope of the present invention.

What is claimed is:

1. A method of determining locations of a multiple circuit elements, whose interconnection relationship is previously determined, in a predetermined area on a substrate based on given positions of input/output (I/O) terminals in designing an integrated circuit so that the circuit elements are placed in the respective determined locations in a subsequent stage of the designing, said method comprising the steps of:

(a) determining locations of sequential circuit elements, each of which functions as a sequential logic, of the multiple circuit elements prior to the remaining circuit elements, based on both said predetermined interconnection relationship of the multiple circuit elements and said given positions of the I/O terminals; and (b) determining locations of non-sequential circuit elements which are the remaining circuit elements in accordance with said determined locations of the sequential circuit elements, based on said predetermined interconnection relationship of the multiple circuit elements and said given positions of the I/O terminals.

2. A method according to claim 1, further comprising the steps of:

dividing the predetermined area of the substrate into a plurality of blocks in which the multiple circuit elements are to be disposed in a predetermined distribution; and setting a shape and a size of each of said blocks commensurate of said locations of the sequential circuit elements which locations have been determined in the first-named determining step (a).

3. A method according to claim 2, further comprising the step of determining points where a connection between the multiple circuit elements intersects a boundary between adjacent blocks of the plural blocks, commensurate with said locations of the sequential circuit elements which locations have been determined in the first-named determining step (a).

4. A method according to claim 1, further comprising the steps of:

dividing the predetermined area of the substrate into a plurality of blocks in which the multiple circuit elements are to be disposed in a predetermined distribution; and determining points where a connection between the of multiple circuit elements intersects a boundary between adjacent blocks of the plural blocks, commensurate with said locations of the sequential circuit elements which locations have been determined in the first-named determining step (a).

5. A method according to claim 1, further comprising the step of extracting information on the I/O terminals and the sequential circuit elements from a netlist, which includes various items of design information about the integrated circuit designing, to create a subnetlist, which includes part of said design information about the interconnection relationship between the sequential circuit elements or between the I/O terminals and the sequential circuit elements, prior to the first-named determining step (a), wherein said locations of the sequential circuit elements are determined in the first-named determining step (a) in accordance with said subnetlist created in said extracting step.

6. A method according to claim 5, wherein said subnetlist includes first data representing the number of non-sequential circuit elements which are to be placed between the sequential circuit elements or between the I/O terminals and the sequential circuit elements.

7. A method according to claim 6, wherein said subnetlist further includes second data representing logical distances between the sequential circuit elements.

8. A method according to claim 7, wherein said locations of the non-sequential circuit elements are determined in the second-named determining step (b) in accordance with both said locations of the sequential circuit elements, which locations have been determined in the first-named determining step (a), and said netlist.

9. A method according to claim 6, further comprising the steps of:

calculating at least one of first delay values between the sequential circuit elements and second delay values between I/O terminals and the sequential circuit elements using both said locations of the sequential circuit elements, which locations have been determined in the first-named determined step (a), and said number of the non-sequential circuit elements, which is included in said subnetlist created in said extracting step; and adjusting said locations ofthe sequential circuit elements, which locations have been determined in the first-named determining steps (a), based on said first and second delay values.

10. A method according to claim 9, wherein said locations of the non-sequential circuit elements are determined in the second-named determining step (b) in accordance with both said locations of the sequential circuit elements, which locations have been determined in the first-named determining step (a), and said netlist.

11. A method according to claim 6, wherein said locations of the non-sequential circuit elements are determined in the second-named determining step (b) in accordance with both said locations of the sequential circuit elements, which locations have been determined in the first-named determining step (a), and said netlist.

12. A method according to claim 5, wherein said subnetlist includes second data representing logical distances one between each pair of the sequential circuit elements.

13. A method according to claim 12, wherein said locations of the non-sequential circuit elements are determined in the second-named determining step (b) in accordance with both said locations ofthe sequential circuit elements, which locations have been determined in the first-named determining step (a), and said netlist.

14. A method according to claim 5, wherein said locations of the non-sequential circuit elements are determined in the second-named determining step (b) in accordance with both said locations ofthe sequential circuit elements, which locations have been determined in the first-named determining step (a), and said netlist.

* * * * *